(12) United States Patent
De Backer

(10) Patent No.: US 11,010,499 B2
(45) Date of Patent: May 18, 2021

(54) USER-SELECTED DYNAMIC DIMENSIONS IN COMPUTER-AIDED DESIGN

(71) Applicant: Bricsys NV, Ghent (BE)

(72) Inventor: Hans De Backer, Sint-Michiels (BE)

(73) Assignee: BRICSYS NV, Ghent (BE)

( * ) Notice: Subject to any disclaimer, the term of this patent is extended or adjusted under 35 U.S.C. 154(b) by 23 days.

(21) Appl. No.: 16/053,852

(22) Filed: Aug. 3, 2018

(65) Prior Publication Data
US 2019/0042669 A1 Feb. 7, 2019

(30) Foreign Application Priority Data

Aug. 3, 2017 (EP) ..................................... 17184641

(51) Int. Cl.
| | |
|---|---|
| *G06T 7/70* | (2017.01) |
| *G06F 3/0487* | (2013.01) |
| *G06F 3/0484* | (2013.01) |
| *G06F 30/00* | (2020.01) |

(52) U.S. Cl.
CPC ............ *G06F 30/00* (2020.01); *G06F 3/0487* (2013.01); *G06F 3/04842* (2013.01); *G06T 7/70* (2017.01)

(58) Field of Classification Search
CPC .... G06F 17/50; G06F 3/0487; G06F 3/04842; G06F 30/00; G06T 7/70
See application file for complete search history.

(56) References Cited

U.S. PATENT DOCUMENTS

| | | | | |
|---|---|---|---|---|
| 5,461,709 | A | * 10/1995 | Brown | ................ G06F 3/04845 715/848 |
| 5,729,750 | A | 3/1998 | Ishida | |
| 5,757,358 | A | * 5/1998 | Osga | .................. G06F 3/04842 345/157 |
| 5,999,186 | A | 12/1999 | Jackson | |
| 6,232,985 | B1 | * 5/2001 | Chase | ..................... G06T 11/60 345/441 |
| 7,039,569 | B1 | 5/2006 | Haws | |
| 9,262,865 | B2 | 2/2016 | Yadav | |
| 2014/0306956 | A1 | * 10/2014 | Yadav | ..................... G06T 17/10 345/420 |

(Continued)

OTHER PUBLICATIONS

Youtube Video Link: https://www.youtube.com/watch?v=QKj8MqvHOf4.

(Continued)

*Primary Examiner* — Cesar B Paula
*Assistant Examiner* — Zelalem "Zee" Shalu
(74) *Attorney, Agent, or Firm* — Maschoff Brennan

(57) ABSTRACT

The current invention concerns a computer-implemented method, a computer system and a computer program product for determining a position in a computer-aided design model. The model comprises a multitude of components. A list of at least two spatially extended and user-selected components is obtained. A cursor is displayed on a visualization means to indicate a position within the model. For each spatially extended component of the list, a distance indicator, indicating the smallest distance of said position to the component, is displayed via the visualization means. Upon providing position movement directions via the at least one user input device said position, said cursor location and said distance indicators are dynamically updated accordingly.

20 Claims, 3 Drawing Sheets

(56) References Cited

U.S. PATENT DOCUMENTS

2019/0095549 A1* 3/2019 De Keyser .......... G06F 3/04845

OTHER PUBLICATIONS

CadVideo Tutorials: "AutoCAD Tutorial—Using Object Snaps Part 2", Feb. 16, 2010.
Harwood Podcast: "Sketchup #11: The Tape Measure Tool", Dec. 19, 2010.
Stork A. et al., "Efficient and Prcise Solid Modelling Using a 3D Input Device", Proceedings of the Fourth Symposium on Solid Modeling and Applications Adtlanta, GA, May 14-16, 1997; vol. SYMP. 4, May 14, 1997, pp. 181-194.
Anonymous, "Rhinoceros 5 for Mac User's Guide", Jun. 19, 2015.
Anonymous, About Polar Tracking and PolarSnap, AutoCAD, Dec. 16, 2015.
Fernando Briones, "Racing track design with geoenzo", May 10, 2016.

* cited by examiner

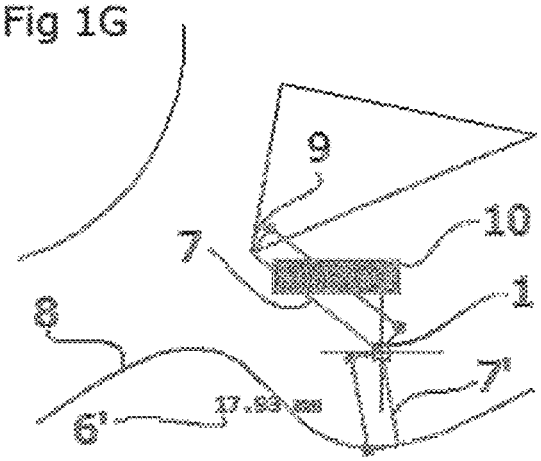
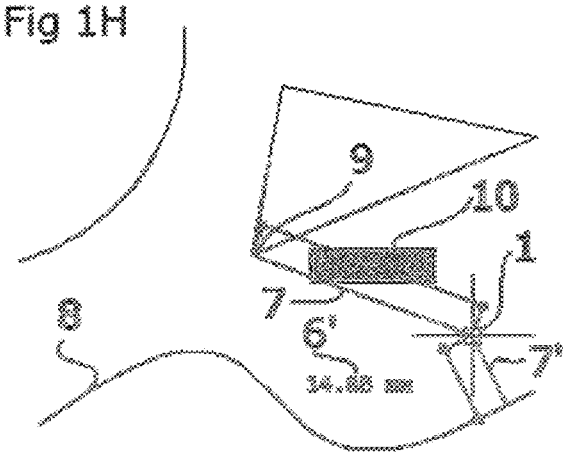

USER-SELECTED DYNAMIC DIMENSIONS IN COMPUTER-AIDED DESIGN

This application claims the benefit of European Application No. 17184641.3 filed Aug. 3, 2017, which is hereby incorporated by reference in their entirety as if fully set forth herein.

TECHNICAL FIELD

The invention pertains to the technical field of computer-aided design (CAD), and in particular to dynamic dimensions.

BACKGROUND

When developing a model with computer-aided design (CAD), the determination of a position relative to multiple components of the model is an often desired feature. The components may be vertices, edges, or surfaces of model objects. Relative positions may be defined via distances and/or angles. Many CAD programs offer the possibility of showing a dynamic dimension on the screen, and preferably near the cursor. This is a relative position indicator of the cursor with respect to a component. For a distance, said relative position indicator may be a line indicating the endpoints between which distance is measured, combined with a textbox comprising a numerical value of the distance. For an angle, said relative position indicator may be an arc between two spatially extending objects indicating the tangent lines and/or tangent surfaces between which the angle is measured, combined with a textbox comprising a numerical value of the angle. When hovering the cursor and thereby altering the relative position, the relative position indicator is updated. A numerical value for the relative position may be entered in the corresponding textbox, often preceded by selecting the textbox and/or rendering the textbox editable, and often subsequently followed by locking the entered numerical value. The cursor can then be moved within the model, subject to the constraint of the locked numerical value for the particular relative position.

ARES Commander 2016 from Gräbert GmbH, for example, comprises a Quick Input dynamic dimension functionality for polylines. A polyline may be drawn by defining a startpoint in the model and by moving the cursor away from the startpoint. Two relative position indicators are shown. A first relative position indicator is the distance between the startpoint and the current location of the cursor within the model. A second relative position indicator is the angle between a horizontal reference line and a line defined by the startpoint and the current location of the cursor within the model.

U.S. Pat. Nos. 5,729,750, 5,999,186, 6,232,985, 7,039,569, and 9,262,863 disclose concepts related to relative positioning in a CAD model.

In the state of the art, some CAD programs offer certain dynamic dimensions. These depend on the context and the command being executed. The dimensions are proposed to users (i.e. 'pushed' to users) as preprogrammed in the CAD program. For the example of the polyline discussed above, the offered relative position indicators are in relation to the startpoint: the distance of the current location of the cursor within the model to the startpoint, and the angle between a horizontal reference line through the startpoint and the line defined by the startpoint and the current location of the cursor within the model.

There remains a need in the art for the display of dynamic dimensions in relation to various and possibly a multitude of components of the CAD model in a user-friendly way, and without clogging the screen with too many relative position indicators.

CAD Video Tutorials: "AutoCAD Tutorial—Using Object Snaps Part 2", https://www.youtube.com/watch?v=nB4q0jvOjys discloses a relative position indicator between a cursor position and a user-selected point of a CAD model.

The teachings in this latter document are however not configured for easily determining distances to a multitude of extended components. This is required, for example, to draw an N-dimensional sphere with $N \geq 2$ tangent to each component of N extended components.

The present invention aims to resolve at least some of the problems mentioned above.

SUMMARY OF THE INVENTION

In a first aspect, the present invention provides a computer-implemented method for determining a position in a computer-aided design model, as disclosed in claim 1.

In a second aspect, the present invention provides a computer system for determining a position in a computer-aided design model, as disclosed in claim 14.

In a third aspect, the present invention provides a tangible non-transitory computer-readable storage medium comprising a computer program product for determining a position in a computer-aided design (CAD) model, as disclosed in claim 15.

The present invention is advantageous as it provides for a list of components of the CAD model, whereby for each component of the list at least one relative position indicator of the position in relation to said component is displayed. The list can be augmented with user-selected components. This allows for display of dynamic dimensions in relation to various components of the CAD model in a user-friendly way. As the user is able to determine the list, the present invention prevents clogging of the screen with too many relative position indicators, while all desired relative position indicators can be shown.

The present invention is furthermore advantageous as it allows for determining a position based on smallest distances with respect to a multitude of spatially extended components. This enables in a subsequent step to utilize the position to draw an object at or based on said position. For example, when all of the smallest distances are equal, the position can serve as center point to draw an N-dimensional sphere tangent to all components.

DESCRIPTION OF FIGURES

FIGS. 1A to 1H show an example of an embodiment of the present invention in a CAD model.

DETAILED DESCRIPTION OF THE INVENTION

Figure 1A:
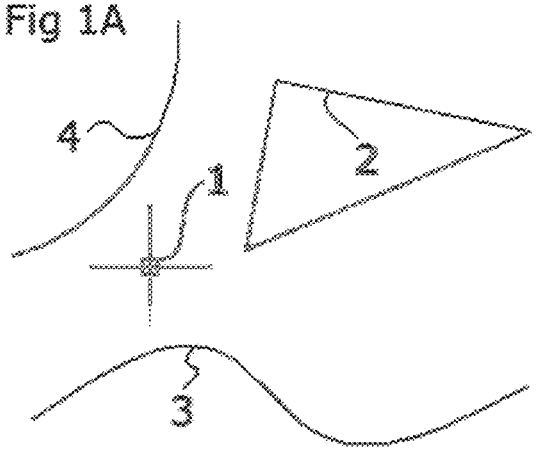

The present invention concerns a computer-implemented method, a computer system, and a computer program product for determining a position in a CAD model. The invention was summarized in the corresponding section above. In what follows, the invention is described in detail, embodiments of the invention are discussed, and the invention is illustrated by means of examples.

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

As used herein, the following terms have the following meanings:

"A", "an", and "the" as used herein refers to both singular and plural referents unless the context clearly dictates otherwise. By way of example, "a compartment" refers to one or more than one compartment.

"Comprise", "comprising", and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

"Computer system" as used herein refers to any device comprising at least one processor and suitable for executing computer-executable instructions. Typically, a set of computer-executable instructions is packaged as a computer program product (CPP) or a software program. A non-limiting list of examples of computer systems comprises a desktop, a laptop, a tablet, a smartphone, a smartwatch, a server, a supercomputer, a distributed computing system, a calculator, a music player, a game console, and the like.

"User input device" as used herein refers to any device configured for providing input by a user to a computer system. The input is not limited by modality and can encompass mechanical movement, sound, images, and the like. The input can be discrete and/or continuous. The input is also not limited by the number of degrees of freedom. The input can be direct or indirect. When input is provided on a position or a position change, e.g. to move a pointer on a screen, the input can be absolute or relative. A non-limiting list of examples of user input devices comprises a keyboard, a computer mouse, a touchpad, a touchscreen, a camera, a scanner, a joystick, a microphone, a light pen, a trackball, a projected keyboard, a game controller, a card reader, and the like.

"Visualization means" as used herein refers to any device or group of devices configured for presenting visual information to a user. A non-limiting list of examples of visualization means comprises a screen, a projector, visualization glasses (i.e. (a) head-mountable screen(s) such as video, theatre, or virtual reality glasses, and the like), a holographic projection device, and the like. Multiple devices can also be used together to form the visualization means. For example, multiple screens connected to a computer system can form a single visualization means.

"Computer-aided design" (CAD) is the use of computer systems to aid in the creation, modification, analysis, or optimization of a model. CAD output is often in the form of electronic files for print, machining, or other manufacturing operations. A non-limiting list of examples of CAD software programs comprises 123D, ACIS, Advance Concrete, Advance Design, Advance Steel, AllyCAD, ArchiCAD, ARES Commander, AutoCAD, BricsCAD, BRL-CAD, C3D, Caddie, Cadwork, CATIA, Chief Architect, Cobalt, Creo, DataCAD, DesignSpark Mechanical, Digital Project, Drawing Express, FINE MEP, form•Z, FreeCAD, HiCAD, IDEA Architectural, Inventor, IRONCAD, IntelliCAD, KeyCreator, LibreCAD, MEDUSA, MicroStation, Modelur, NanoCAD, NX, OpenCASCADE, OpenSCAD, Parasolid, PTC Creo, PowerCADD, progeCAD, PunchCAD, QCad, Revit Architecture, Revit MEP, Revit Structure, Rhinoceros 3D, RoutCad, SALOME, ShapeManager, SketchUp, Solid Edge, SolidWorks, SolveSpace, SpaceClaim, SpaceClaim Engineer, Tekla Structures, TopSolid, TransMagic, TurboCAD, VariCAD, VectorWorks, and VisualARQ. This non-limiting list comprises CAD software programs for drawing two-dimensional building plans as well as CAD software programs for building information modeling (BIM). A non-limiting list of BIM software programs comprises Allplan, ArchiCAD, ARCHLine.XP, Autodesk Revit, BricsCAD, CodeBook, DDS-CAD, Digital Project, FINE MEP, GRAITEC Advance, IDEA Architectural, MicroStation, Navisworks, OpenStudio, RFEM, Tekla BIMsight, Tekla Structures, Trimble SketchUp, VectorWorks Architect, Vico Office, and VisualARQ.

A CAD model comprises two or three spatial dimensions, i.e. the CAD model is a two- or three-dimensional model. A CAD model can be used for representation of one or more objects. A three-dimensional CAD model may be used for representation of three-dimensional solids. A three-dimensional solid can be delimited (i.e. bounded) by surfaces. Intersecting surfaces define edges (lines) and vertices. A two- or three-dimensional CAD model may be used for representation of two-dimensional elements, such as, for example, a projected floor plan. A two-dimensional element can be delimited by edges (lines). Intersecting edges (lines) define vertices. A surface may be flat or may comprise a curvature. An edge (line) may be straight or may comprise a curvature.

The present invention preferably utilizes a Euclidian coordinate system. Alternatively, an angle-based coordinate system may be used, such as, for example, polar coordinates (2D), cylindrical coordinates (3D), or spherical coordinates (3D).

"Components" as used herein refers to object boundaries or drawing aid references. A component of a CAD model corresponds with a component category. A non-limiting list of component categories comprises a vertex, an edge, and a surface. "Edge" as used herein also refers to line. "Vertex" as used herein also refers to point.

The present invention concerns computer-aided design, and in particular building information modelling. Therefore, the present invention concerns a computer-implemented method, a computer system, and a computer program product for determining a position in a computer-aided design model, and in particular a position in a building information model. One of ordinary skill in the art will however appreciate that the present invention may be utilized for determining a position in any CAD model, such as, for example, a CAD model in mechanical engineering. A non-limiting list of examples of BIM objects comprises a bath, a beam, a column, a door, an electric plug, an elevator, a faucet, a lamp, a pipe, a ramp, a roof, a shell, a skylight, a slab, a staircase, a toilet, a tube, a wall, a washing sink, a window, and the like. A non-limiting list of examples of mechanical engineering CAD objects comprises a gear, a roller bearing, a shaft, a tube, and the like.

In a first aspect, the invention provides a computer-implemented method for determining a position in a CAD model via a computer system. In a second aspect, the invention provides a computer system for determining a position in a CAD model, i.e. a computer system configured for performing the computer-implemented method according to the first aspect. In a third aspect, the invention provides a tangible non-transitory computer-readable storage medium comprising a computer program product (CPP)

for determining a position in a CAD model, whereby the CPP comprises CPP instructions for execution on a computer system according to the second aspect, and whereby the CPP instructions comprise instructions for performing the different steps of the method according to the first aspect. One of ordinary skill in the art will hence appreciate that the three aspects of the present invention are interrelated. Therefore, in what follows no further distinction will be made between the three aspects of the present invention.

The computer system comprises at least one processor, a visualization means, and at least one user input device. The CAD model comprises a multitude of components. The model is displayed at least partially via the visualization means. A cursor is displayed via the visualization means to indicate a position within the model. A list of components of the model is obtained. A component of the model is thereto selected via said at least one user input device and the selected component is added to the list. For each component of the list at least one relative position indicator of said position in relation to said component is displayed via the visualization means. Upon receiving position movement directions via said at least one user input device, said position is dynamically updated, and thereby the cursor location and the relative position indicators displayed via the visualization means are dynamically updated accordingly.

A non-limiting list of examples of relative position indicators comprises a distance indicator and an angle indicator. A relative position indicator can hence indicate a distance or an angle.

In a preferred embodiment, the full list of components is user-selected from the components of the CAD model. In this case, each component of the list is selected via the at least one user input device and added to the list. In an alternative embodiment, the list of components comprises at least one computer-selected component, e.g. based on context and/or based on the command being executed. In this latter alternative embodiment, according to the invention, at least one component is user-selected and added to the list, in addition to said at least one computer-selected component. The list will typically be filled with one component at a time. Alternatively, the user may also be allowed to select multiple components and to add these selected multiple components to the list in a single joint addition step.

"List" as used herein refers to any collection, set, or subset of constituents. Within the context of the present invention, the constituents are components. A list may or may not comprise an ordering. A list may comprise a maximum number of possible constituents or may be dynamically extendable. A list may comprise its constituents or may comprise references or pointers to its constituents. Within the context of the present invention, the "list of components" preferably comprises references or pointers to the components. The addition of a component to the list has to be interpreted in this case as the addition of a reference or a pointer to said component to the list.

The present invention teaches that a component is selected via the at least one user input device and added to the list. Thereby one component may be selected via the at least one user input device and added to the list. Alternatively, two components may be selected via the at least one user input device and added to the list. In a further alternative, three components may be selected via the at least one user input device and added to the list. In other alternatives, four, five, six, seven, eight, nine, ten, eleven, twelve, thirteen, fourteen, fifteen, sixteen, seventeen, eighteen, nineteen, twenty or more components may be selected via the at least one user input device and added to the list.

This is advantageous because users can add a component to the list for which they want to observe via the visualization means at least one relative position indicator for said position in relation to said component. This allows for display of dynamic dimensions in relation to various components of the CAD model in a user-friendly way. The determined position in the CAD model may then be utilized as reference point for a CAD action. A CAD action may be the drawing or insertion of a new object or a new component; or the moving of the origin location, an object, or a component in the CAD model.

In a preferred embodiment, the invention further provides for removing an unwanted component from the list by selecting the unwanted component via said at least one user input device and removing the selected unwanted component from the list. This is advantageous as the output displayed by the visualization means will not be clogged with undesired relative position indicators.

In a preferred embodiment, selecting a component of the model comprises the steps of updating said position upon receiving position movement directions via said at least one user input device to within a predetermined distance of said component and thereby updating the cursor location displayed via the visualization means accordingly; and registering the selection of said component upon receiving selection directions via said at least one user input device when said position is within the predetermined distance of said component. Preferably, said component is displayed in a visually altered manner when said position is within the predetermined distance of said component. A visually altered manner can hereby involve a change in color, a change in form (e.g. dashed edge (line); dotted or shaded surface), a change in size or thickness, an inserted additional indication (pointing arrow; bounding box or shape), the like, or a combination thereof. In a preferred embodiment, said visually altered manner comprises displaying a suggested relative position indicator. This is advantageous as it allows for an immediate visual identification of the component which may be selected for addition to the list of components. This preferred embodiment with or without the visually altered manner can also be utilized for removal of an unwanted component from the list.

It may occur that multiple components are within said predetermined distance of said position. In a preferred embodiment, the present invention then provides for the following:

when said multiple components comprises a subset of vertices, the vertex of said subset of vertices with the smallest distance to said position is displayed in a visually altered manner for selection;

when said multiple components comprises a subset of edges but no vertices, the edge of said subset of edges with the smallest distance to said position is displayed in a visually altered manner for selection; and when said multiple components comprises a subset of surfaces but no vertices or edges, the surface of said subset of surfaces with the smallest distance to said position is displayed in a visually altered manner for selection.

This is advantageous as this preferred embodiment considers the component categories in order of spatial extent from small to large. A small component is more difficult to select than a larger component. Consider, for example, an edge comprising two vertices. When said position (represented by the cursor location via the visualization means) is within said predetermined distance of one of these vertices, it is also within said predetermined distance of said edge.

Said edge may however still be selected by moving away from the vertex while remaining near the edge. By considering the component categories in order of spatial extent from small to large, all categories of components are user selectable. Furthermore, it may be possible to zoom in or zoom out on the CAD model. The predetermined distance may thereby change, preferably as to yield a threshold for selection on the visualization means which is approximately invariant with zoom level. Alternatively, the predetermined distance may be determined from the onset based on displaying size via said visualization means as opposed to world distances as used within the model.

In a preferred embodiment, a relative position indicator in relation to a component is a distance indicator, which indicates the smallest distance of said position to said component. Consider, for example, a horizontal line segment comprising a left outer end and a right outer end in a CAD model. When said position (represented by the cursor via the visualization means) is directly above the line segment, the distance is measured perpendicular to said line segment. When said position is above and to the right of the line segment, the distance is measured in between said position and the right outer end. Upon locking said distance and providing position movement directions via said at least one user input device, it may be possible to make said position (and hence also said cursor) follow a racetrack-shaped path around the line segment. Note that for curved extended components, the direction perpendicular to the component may vary over the component.

In a preferred embodiment, when said component comprises a spatial extent and when said smallest distance to said component is determined along a direction non-perpendicular to said spatially extended component, an angle indicator is automatically displayed in addition to said distance indicator. Referring to the above example of a horizontal line segment comprising a left outer end and a right outer end. Upon locking the distance of said position to the line segment, a racetrack-shaped path around the line segment may be followed. The racetrack-shaped path around the line segment comprises straight parts parallel to the line segment, a left half circle, and a right half circle. When said position is changed from a straight part to a half-circular part of the racetrack-shaped path, the distance is determined in a direction non-perpendicular to the line segment, and an additional angle indicator is displayed via the visualization means. Said angle indicator may indicate an angle with the horizontal line segment. Said angle indicator may indicate an angle with the vertical normal which is perpendicular to the horizontal line segment. In general, an angle indicator may indicate an angle with a tangent direction or tangent plane at the endpoint or edge of a curve or surface. Alternatively, an angle indicator may indicate an angle with a normal (perpendicular) direction to said tangent direction or tangent plane.

A relative position indicator comprises a numerical value displayed via the visualization means. In a preferred embodiment, upon selecting the numerical value, the relative position indicator comprises an editable textbox comprising said numerical value. The numerical value can be edited via the at least one user input device. Upon editing said numerical value, said position and said cursor location are adjusted accordingly. Preferably, said numeral value is displayed near the cursor location or in between the cursor and the component in relation to which the relative position is indicated. Alternatively or additionally, a separate region displayed via the visualization means may be provided to display numerical values of relative position indicators, such as a command line interface or a dedicated relative position indicator frame.

In a preferred embodiment, the numerical value of a relative position indicator can be locked. The updating of said position and said cursor location are subsequently restricted to comply with said locked numerical value. Preferably, said step of said locking is automatically performed upon said editing of said numerical value. Referring to the above example of a horizontal line segment comprising a left outer end and a right outer end. The distance of said position to the line segment may be locked by selecting and editing the numerical value of the relative distance indicator, thereby automatically locking said distance.

In a particularly preferred embodiment, a list of at least two spatially extended components is obtained. A non-limiting list of spatially extended components comprises an edge (line) and a surface. One of ordinary skill in the art will appreciate that a vertex (point) is not a spatially extended component. Obtaining said list thereby comprises the steps of selecting a spatially extended component of the model via said at least one user input device and adding the selected component to said list. For each spatially extended component of the list, a distance indicator is displayed via the visualization means, whereby the distance indicator indicates the smallest distance of said position to said component. Upon receiving position movement directions via said at least one user input device, said position is dynamically updated, and thereby the cursor location and the distance indicators displayed via the visualization means are dynamically updated as well.

The present invention is furthermore advantageous as it allows for determining a position based on smallest distances with respect to a multitude of spatially extended components. This enables in a subsequent step to utilize the position to draw an object at or based on said position. For example, when all of the smallest distances are equal, the position can serve as center point to draw an N-dimensional sphere tangent to all components.

In a preferred embodiment, one or more of said smallest distances of said position to said spatially extended components of said list may be parametrically defined via said at least one user input device.

In a preferred embodiment, multiple of said smallest distances of said position to said spatially extended components of said list may relatively constrained via said at least one user input device.

In a preferred embodiment, one or more of said smallest distances of said position to said spatially extended components of said list may be locked via said at least one user input device.

For example, a first distance to a first extended component may be parametrically defined as $d_1$. A second distance to a second extended component may be parametrically defined as $2 \cdot d_1$, thereby constraining changes of said position. Alternatively or additionally, each distance may comprise a predefined parameter, such as $d_1$ for the first distance, enabling a user to parametrically set the second distance $d_2=2 \cdot d_1$, without having to define the parameter $d_1$ first. The user may then lock the value of the second distance to, for example, 10 m, thereby automatically locking the value of the first distance to 5 m.

The invention is further described by the following non-limiting examples which further illustrate the invention, and are not intended to, nor should they be interpreted to, limit the scope of the invention.

EXAMPLE 1

FIG. 1A shows a representation of a CAD model as displayed on a computer screen. A position within the model is represented by a cursor (1). On the screen, a first (2), a second (3) and a third (4) object are at least partially displayed.

When the position is changed by means of a computer mouse, touchpad, trackball or the like to within a predetermined distance of a boundary component of one of the objects, a relative position indicator is suggested in relation to the boundary component.

Figure 1B:
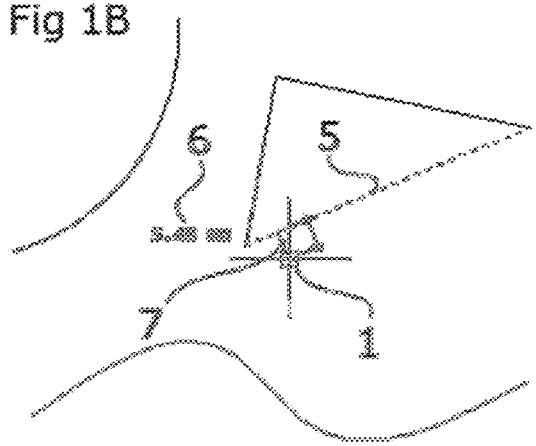
Figure 1C:
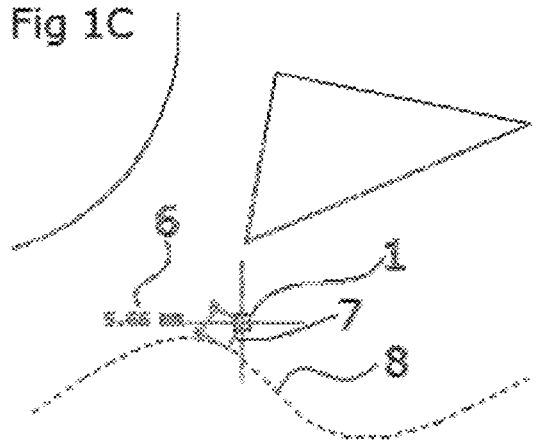

In FIG. 1B, the cursor (1) is moved to within the predetermined distance of a line (5) of the first object. The line (5) is displayed in a visually altered manner, in this case dashed and with an altered color. In addition, a distance indicator (7) comprising a numerical value (6) is suggested on the screen. In FIG. 1C, the cursor (1) is positioned within the predetermined distance of an edge (8) of the second object.

Again the edge (8) is displayed in a visually altered manner, in this case dashed and with an altered color. In addition, a distance indicator (7) comprising a numerical value (6) is suggested on the screen. Note that the distance is measured perpendicular to the edge (8).

Figure 1D:
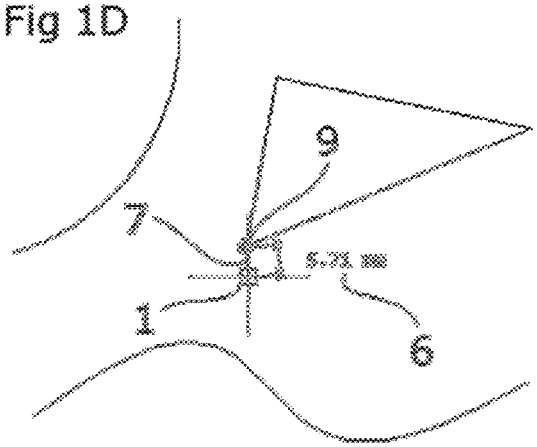
Figure 1E:
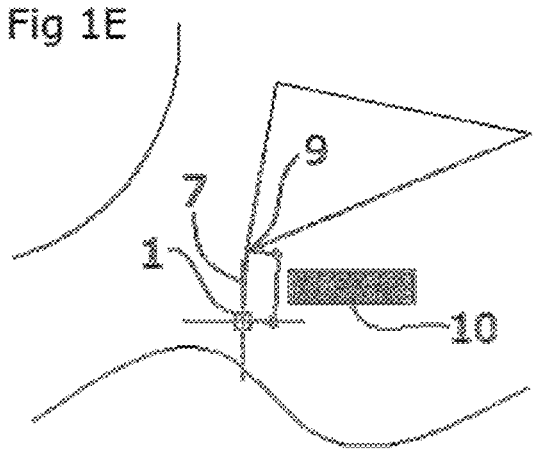

In FIG. 1D, the cursor (1) is moved to within the predetermined distance of a vertex (9) of the first object. Because the vertex (9) lies on the crossing of two lines of the first object, the cursor is within the predetermined distance of the vertex (9) as well as the two lines. Suggestion of a vertex takes precedence over suggestion of an edge/line, and therefore a distance indicator (7) is suggested in relation to the vertex (9). The vertex (9) is shown in this case as a larger dot and with an altered color. The distance indicator (7) comprises a numerical value (6). The user can select the vertex (9) and add it to the list of components by a computer mouse click or keyboard stroke. The situation upon selection is displayed in FIG. 1E. The vertex (9) is no longer represented in a visually altered manner, but is represented in the regular manner. The distance indicator (7) is shown even when the cursor (1) is no longer within the predetermined distance of the vertex (9). The distance indicator (7) displayed on the screen further comprises a numerical value in an editable textbox (10).

Figure 1F:
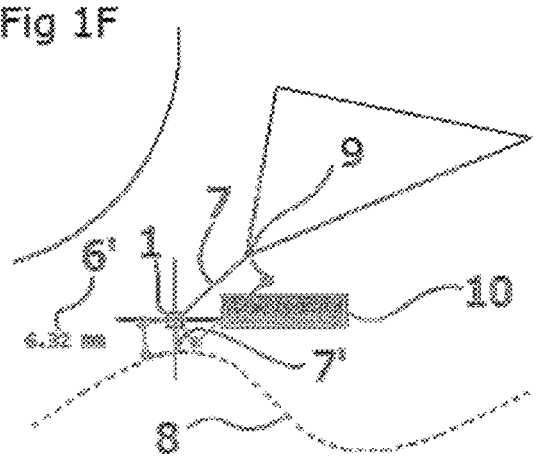

In FIG. 1F, the cursor (1) has been moved to within the predetermined distance of the edge (8) of the second object. A distance indicator (7') comprising a numerical value (6') is shown on the screen, indicating the distance in between the position represented by the cursor and the edge (8). The edge (8) is again shown dashed and with an altered color, as before. The user can select the edge (8) and add it to the list of components by a computer mouse click or keyboard input. The situation upon selection is displayed in FIGS. 1G and 1H. The edge (8) is no longer represented in a visually altered manner, but is represented in the regular manner. The distance indicator (7') is shown even when the cursor is no longer within the predetermined distance of the edge (8). As only one distance can be edited at a time, only one of the numerical values is displayed in a textbox (10). Upon entering a new numerical value with the keyboard said distance will be locked and the other numerical value will be displayed in a textbox.

When the position is determined as desired by the user, the position can be used for a CAD action such as drawing, inserting or moving objects and/or references, as indicated in the detailed description above.

EXAMPLE 2

In a three-dimensional CAD model, a user wishes to draw a sphere tangent to three extended components. The user may select the three components, which are subsequently added to the list. To each of the three components, a distance indicator is shown from the cursor position via the visualization means. Upon cursor movement, the distance indicator is dynamically adjusted, thereby dynamically adjusting the point of smallest distance on the extended object as well as the corresponding distance value of the distance indicator.

The user can, at least conceptually, move the cursor to define a common distance with respect to each of the components. However, movement of the cursor to adjust all three distances to a desired value simultaneously may be a difficult task to perform.

The user can, alternatively, sequentially lock the distances one at a time, to a desired sphere radius, thereby obtaining a center position to start drawing. For three mutually orthogonal planes in three-dimensional space, for any choice of the radius, a sphere can be drawn, and this option works well. However, this may be a difficult task if the number of components and/or the nature of the components are such that only one or a limited number of possible sphere radii exist, of which the user has no a priori knowledge.

The user can, alternatively, parametrically set the distances of said position to the second and third components equal to the distance of said position to the first component. Cursor movement/position changes then comprise a relative constraint between the distances, and upon attempting to move the cursor, the user may perceive on the visualization means that the cursor positions are confined subject to the constraints.

The invention claimed is:

1. Computer-implemented method for determining a position in a computer-aided design model via a computer system, the model comprising one or more objects and a multitude of components, the multitude of components being object boundaries or drawing aid references, the computer system comprising at least one processor, a visualization means, and at least one user input device, the method comprising the steps of:

displaying said model at least partially via the visualization means;

displaying a cursor via the visualization means to indicate a position within the model;

obtaining a list of at least two spatially extended components of the model, wherein obtaining said list comprises the steps of:

selecting a spatially extended component of the model via said at least one user input device; and adding the selected component to said list;

displaying for each spatially extended component of the list a distance indicator indicating the smallest distance of said position to said component via the visualization means;

dynamically updating said position upon receiving position movement directions via said at least one user input device and thereby dynamically updating the cursor location and the distance indicators displayed via the visualization means; and constraining one or more of said smallest distances of said position to said spatially extended components of said list via said at least one user input device, thereby constraining said position and said cursor location and dynamic updating of said position and said cursor location based on said constrained one or more smallest distances.

2. Computer-implemented method according to claim 1, wherein the method comprises the step of parametrically defining one or more of said smallest distances of said position to said spatially extended components of said list via said at least one user input device, thereby constraining said position and said cursor location and dynamic updating of said position and said cursor location based on said parametrically defined smallest distances.

3. Computer-implemented method according to claim 1, wherein the method comprises the step of relatively constraining multiple of said smallest distances of said position to said spatially extended components of said list via said at least one user input device, said relatively constraining comprising introducing an interdependency between said multiple of said smallest distances, thereby constraining said position and said cursor location and dynamic updating of said position and said cursor location based on said relatively constrained smallest distances.

4. Computer-implemented method according to claim 1, wherein the method comprises the step of locking one or more of said smallest distances of said position to said spatially extended components of said list via said at least one user input device, thereby constraining said position and said cursor location and dynamic updating of said position and said cursor location based on said locked smallest distances.

5. Computer-implemented method according to claim 1, wherein the step of selecting a component of the model comprises the steps of:
  updating said position upon receiving position movement directions via said at least one user input device to within a predetermined distance of said component and thereby updating the cursor location displayed via the visualization means; and
  registering the selection of said component upon receiving selection directions via said at least one user input device when said position is within the predetermined distance of said component.

6. Computer-implemented method according to claim 1, wherein the step of selecting a component of the model comprises the step of displaying said component in a visually altered manner when said position is within the predetermined distance of said component.

7. Computer-implemented method according to claim 6, wherein said visually altered manner comprises displaying a suggested distance indicator.

8. Computer-implemented method according to claim 1, wherein a component corresponds with one of the following component categories: a vertex, an edge, and a surface.

9. Computer-implemented method according to claim 6, wherein multiple components are within the predetermined distance of said position, and:
  when said multiple components comprises a subset of vertices, the vertex of said subset of vertices with the smallest distance to said position is displayed in a visually altered manner for selection;
  when said multiple components comprises a subset of edges but no vertices, the edge of said subset of edges with a smallest distance to said position is displayed in a visually altered manner for selection; and
  when said multiple components comprises a subset of surfaces but no vertices or edges, the surface of said subset of surfaces with the smallest distance to said position is displayed in a visually altered manner for selection.

10. Computer-implemented method according to claim 9, wherein, when said smallest distance to said component is determined along a direction non-perpendicular to said spatially extended component, an angle indicator is automatically displayed in addition to said distance indicator.

11. Computer-implemented method according to claim 1, wherein a distance indicator comprises a numerical value and wherein the method comprises the step of editing the numerical value via the at least one user input device and thereby adjusting said position and said cursor location accordingly.

12. Computer-implemented method according to claim 11, wherein the method comprises the step of locking the numerical value of a distance indicator, thereby subsequently restricting updating of said position and said cursor location to comply with said locked numerical value.

13. Computer-implemented method according to claim 12, wherein said step of said locking is automatically performed upon said editing of said numerical value.

14. Computer system for determining a position in a computer-aided design model, the model comprising one or more objects and a multitude of components, the multitude of components being object boundaries or drawing aid references, the computer system comprising at least one processor, a visualization means, and at least one user input device, the computer system configured for:
  displaying said model at least partially via the visualization means;
  displaying a cursor via the visualization means to indicate a position within the model;
  obtaining a list of at least two spatially extended components of the model, wherein obtaining said list comprises the steps of:
    selecting a spatially extended component of the model via said at least one user input device; and
    adding the selected component to said list;
  displaying for each spatially extended component of the list a distance indicator indicating the smallest distance of said position to said component via the visualization means;
  dynamically updating said position upon receiving position movement directions via said at least one user input device and thereby dynamically updating the cursor location and the distance indicators displayed via the visualization means accordingly; and
  constraining one or more of said smallest distances of said position to said spatially extended components of said list via said at least one user input device, thereby constraining said position and said cursor location and dynamic updating of said position and said cursor location based on said constrained one or more smallest distances.

15. Tangible non-transitory computer-readable storage medium comprising a computer program product for determining a position in a computer-aided design model, the model comprising a multitude of components, the computer program product comprising computer program product instructions for execution on a computer system comprising at least one processor, a visualization means, and at least one user input device, the computer program product instructions comprising instructions for:
  displaying said model at least partially via the visualization means, the model comprising one or more objects and a multitude of components, the multitude of components being object boundaries or drawing aid references;
  displaying a cursor via the visualization means to indicate a position within the model;
  obtaining a list of at least two spatially extended components of the model, wherein obtaining said list comprises the steps of:

selecting a spatially extended component of the model via said at least one user input device; and adding the selected component to said list;

displaying for each spatially extended component of the list a distance indicator indicating the smallest distance of said position to said component via the visualization means;

dynamically updating said position upon receiving position movement directions via said at least one user input device and thereby dynamically updating the cursor location and the distance indicators displayed via the visualization means accordingly; and constraining one or more of said smallest distances of said position to said spatially extended components of said list via said at least one user input device, thereby constraining said position and said cursor location and dynamic updating of said position and said cursor location based on said constrained one or more smallest distances.

16. Computer-implemented method according to claim 1, wherein the distance indicator comprises a line indicating the endpoints between which distance is measured.

17. Computer-implemented method according to claim 1, wherein said step of displaying for each spatially extended component of the list the distance indicator indicating the smallest distance of said position to said component via the visualization means includes:

displaying via the visualization means for each spatially extended component of the list a distance indicator indicating a point on the spatially extended component with the smallest distance to said position.

18. Computer-implemented method according to claim 1, wherein the multitude of components are object boundaries.

19. Computer system according to claim 14, wherein the multitude of components are object boundaries.

20. Tangible non-transitory computer-readable storage medium according to claim 15, wherein the multitude of components are object boundaries.

\* \* \* \* \*